United States Patent
Sugiyama

(10) Patent No.: US 7,161,510 B2
(45) Date of Patent: Jan. 9, 2007

(54) SWITCHING AMPLIFIER COMPRISING A DELTA-SIGMA MODULATION CIRCUIT

(75) Inventor: Michinori Sugiyama, Ootawara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/280,390

(22) Filed: Nov. 17, 2005

(65) Prior Publication Data

US 2006/0125667 A1 Jun. 15, 2006

(30) Foreign Application Priority Data

Dec. 14, 2004 (JP) .............................. 2004-360765

(51) Int. Cl.
*H03M 1/00* (2006.01)
*H03F 3/38* (2006.01)

(52) U.S. Cl. .......................... 341/110; 341/143; 330/10

(58) Field of Classification Search ........ 341/110–150; 330/10–100
See application file for complete search history.

(56) References Cited

U.S. PATENT DOCUMENTS

| 6,107,875 | A | 8/2000 | Pullen et al. | |
|---|---|---|---|---|
| 6,556,159 | B1 | 4/2003 | Fei et al. | |
| 6,700,518 | B1 * | 3/2004 | Kishida | ....................... 341/143 |
| 6,765,518 | B1 | 7/2004 | Olson et al. | |
| 6,781,458 | B1 * | 8/2004 | Mazda | ....................... 330/251 |
| 6,794,931 | B1 * | 9/2004 | Kenington | .................... 330/10 |
| 6,970,123 | B1 * | 11/2005 | Sahandiesfanjani | ......... 341/143 |
| 2003/0174026 | A1 * | 9/2003 | Adachi et al. | .............. 332/117 |
| 2004/0036640 | A1 | 2/2004 | Kawamura | |
| 2004/0100328 | A1 | 5/2004 | Melanson | |

FOREIGN PATENT DOCUMENTS

| JP | 2003-060508 A | 2/2003 |
|---|---|---|
| JP | 2004-080152 A | 3/2004 |

* cited by examiner

*Primary Examiner*—Rexford Barnie
*Assistant Examiner*—Lam T. Mai
(74) *Attorney, Agent, or Firm*—Birch, Stewart, Kolasch & Birch, LLP

(57) ABSTRACT

A switching amplifier is provided with a delta-sigma modulation circuit that performs delta-sigma modulation of an input signal that is either an analog signal or a multi-bit signal and outputs a quantized signal, a pulse amplifier that has a switching element and performs pulse amplification of the quantized signal by switching the switching element according to the quantized signal, an amplitude level detection circuit that detects the amplitude level of the input signal, and a sampling frequency adjuster that varies, according to the detection result of the amplitude level detection circuit, the sampling frequency of a quantizer included in the delta-sigma modulation circuit. The sampling frequency adjuster consists, for example, of a frequency division circuit and a multiplexer. With this configuration, it is possible to obtain a desired oscillation threshold and achieve higher electric power efficiency.

8 Claims, 7 Drawing Sheets

Fig. 2

| AMPLITUDE LEVEL | X | Y | OUTPUT OF MULTIPLEXER |
|---|---|---|---|
| IV | L | L | A |
| III | H | L | B |
| II | L | H | C |
| I | H | H | D |

SWITCHING AMPLIFIER COMPRISING A DELTA-SIGMA MODULATION CIRCUIT

This nonprovisional application claims priority under 35 U.S.C. § 119(a) on patent application No. 2004-360765 filed in Japan on Dec. 14, 2004, the entire contents of which are hereby incorporated by reference.

BACKGROUND OF THE INVENTION

1. Field of the Invention

The present invention relates to a switching amplifier that performs pulse amplification by using as a switching control signal a quantized signal obtained by delta-sigma modulation.

2. Description of Related Art

An example of the configuration of a conventional switching amplifier is shown in FIG. 10. The conventional switching amplifier shown in FIG. 10 is a switching amplifier that performs pulse amplification by using as a switching control signal a quantized signal obtained by delta-sigma modulation, and is composed of a delta-sigma modulation circuit 1, a pulse amplifier 6, a low-pass filter 7, and an attenuator 8. The delta-sigma modulation circuit 1 consists of an adder 2, a group of integrators 3, an adder 4, and a quantizer 5.

The delta-sigma modulation circuit 1 converts an input signal $S_{IN}$ that is either an analog signal or a multi-bit signal into a 1-bit signal, and then sends the 1-bit signal to the pulse amplifier 6. The pulse amplifier 6 has a switching element (not shown) such as a FET. The pulse amplifier 6 performs power amplification of the 1-bit signal by switching the switching element according to the 1-bit signal, and then sends the 1-bit signal thus power-amplified to the low-pass filter 7 and the attenuator 8. The low-pass filter 7 eliminates high-frequency components from the output signal of the pulse amplifier 6, and then outputs an output signal $S_{OUT}$ that is an analog signal. The output signal $S_{OUT}$ thus obtained serves as an output signal of the switching amplifier. On the other hand, the output signal of the pulse amplifier 6 is attenuated by the attenuator 8, and is then negatively fed back to the delta-sigma modulation circuit 1.

When the delta-sigma modulation circuit is made to operate at a higher sampling frequency, it is possible to make the oscillation threshold higher, and improve the S/N ratio. However, the problem here is that, in the conventional switching amplifier shown in FIG. 10, when the delta-sigma modulation circuit 1 is made to operate at a higher sampling frequency, the number of switching operations performed by the switching element in the pulse amplifier 6 is increased. This increases switching losses, leading to lower electric power efficiency. Therefore, from the viewpoint of energy saving, it is undesirable to increase unnecessarily the sampling frequency in the delta-sigma modulation circuit 1 because it results in higher electric power consumption in the switching amplifier.

Japanese Patent Application Laid-Open No. 2004-80152 discloses a delta-sigma modulator that can use a sampling frequency while switching it from one frequency to another, but does not disclose which criterion is used to switch a sampling frequency. On the other hand, Japanese Patent Application Laid-Open No. 2003-60508 discloses a delta-sigma modulator that can use a sampling frequency while switching it from one frequency to another according to a type of a signal (audio or voice) to be processed, but does not give any consideration to the oscillation threshold.

SUMMARY OF THE INVENTION

An object of the present invention is to provide a switching amplifier that can obtain a desired oscillation threshold and achieve higher electric power efficiency.

To achieve the above object, according to the present invention, a switching amplifier is provided with: a delta-sigma modulation circuit that is a circuit for performing delta-sigma modulation of an input signal and outputting a quantized signal, the delta-sigma modulation circuit including a group of integrators that consists of a plurality of integrators connected in a cascade arrangement and receives the input signal at a first-stage integrator, and a quantizer that quantizes a signal based on an output signal of the group of integrators and outputs a quantized signal, the delta-sigma modulation circuit that feeds back a signal based on the quantized signal to the first-stage integrator; a pulse amplifier that has a switching element and performs pulse amplification of the quantized signal by switching the switching element according to the quantized signal; an amplitude level detector that detects the amplitude level of the input signal; and a sampling frequency adjuster that varies the sampling frequency of the quantizer according to the detection result of the amplitude level detector.

With this configuration, the sampling frequency of the delta-sigma modulation circuit varies according to the amplitude level of the input signal. This makes it possible to make higher the sampling frequency of the delta-sigma modulation circuit only when a higher oscillation threshold is required due to a high amplitude level of the input signal. This makes it possible to reduce to a minimum the number of switching operations performed by the pulse amplifier in a steady state in which the amplitude level of the input signal is low, making it possible to obtain a desired oscillation threshold and improve electric power efficiency.

Preferably, the switching amplifier configured as described above may be provided with a converter that converts an output signal of the pulse amplifier into an analog signal. This makes it possible to perform analog output.

Preferably, the switching amplifier configured as described above may be provided with an attenuator that attenuates an output signal of the pulse amplifier and then feeds back the attenuated signal to the first-stage integrator. This makes it possible to improve the distortion factor and the S/N ratio of the pulse amplifier.

Preferably, in the switching amplifier configured as described above, the plurality of integrators included in the group of integrators may be CR integrators. This makes it possible to fix the zero-point frequency of the delta-sigma modulation circuit even when the sampling frequency of the delta-sigma modulation circuit is switched from one frequency to another, and thereby stabilize the distribution of quantization noise.

BRIEF DESCRIPTION OF THE DRAWINGS

FIG. 2 is a table showing a selection characteristic of the multiplexer included in the switching amplifier shown in FIG. 1.

DETAILED DESCRIPTION OF PREFERRED EMBODIMENTS

Figure 1:
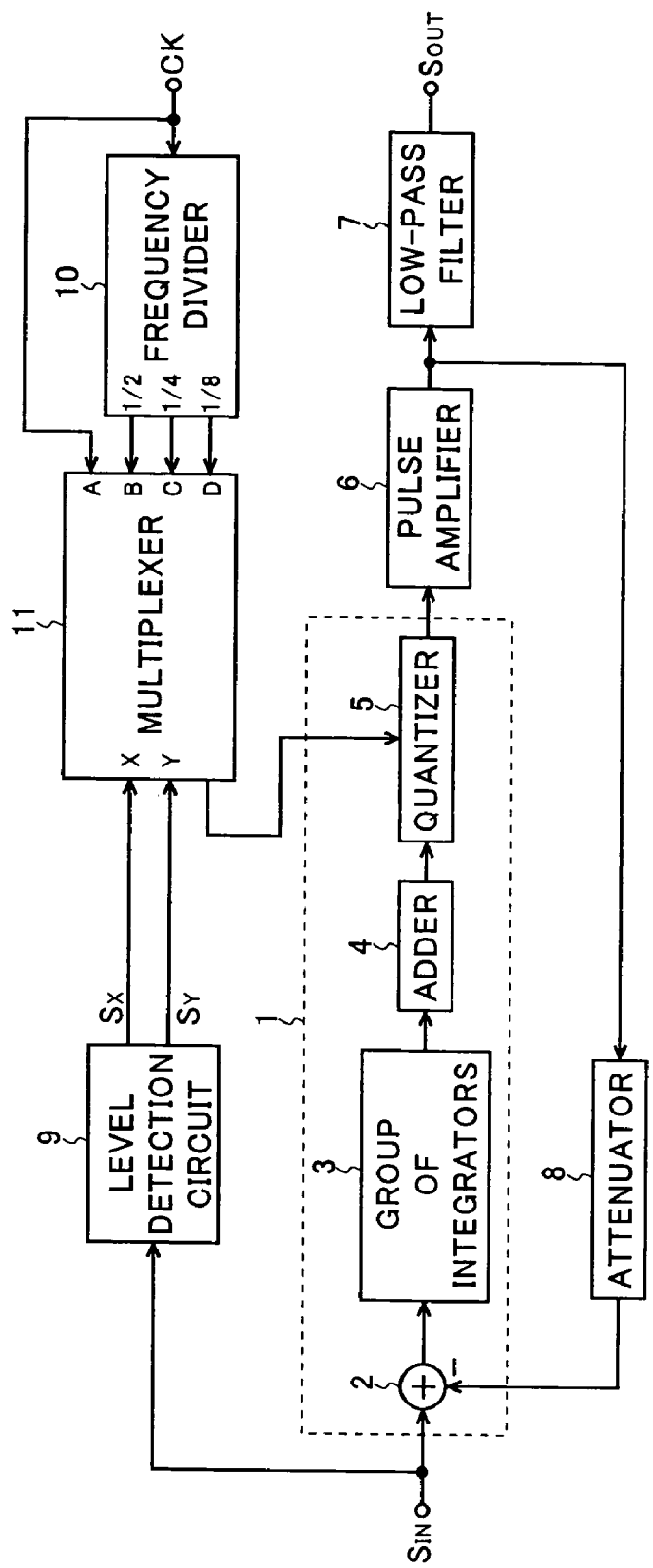
FIG. 1 is a diagram showing an example of the configuration of the switching amplifier of the present invention.
Figure 10:
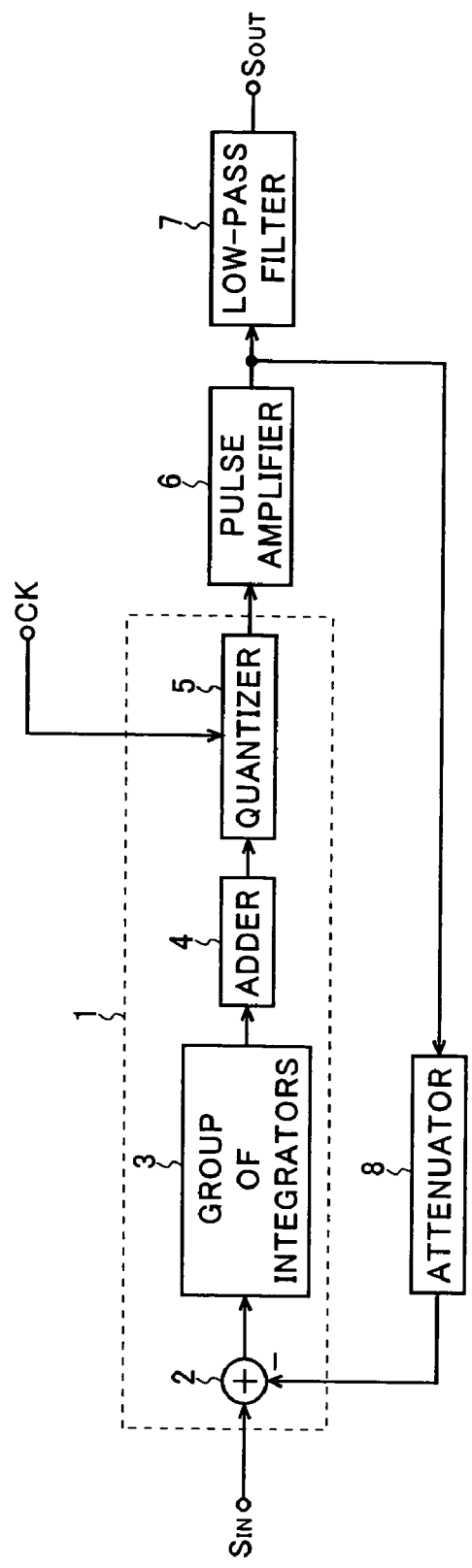
FIG. 10 is a diagram showing an example of the configuration of a conventional switching amplifier.

Hereinafter, embodiments of the present invention will be described with reference to the accompanying drawings. FIG. 1 shows an example of the configuration of the switching amplifier of the present invention. It is to be noted that such parts in FIG. 1 as are found also in FIG. 10 are identified with common reference numerals.

The switching amplifier of the present invention shown in FIG. 1 is a switching amplifier that performs pulse amplification by using as a switching control signal a quantized signal obtained by delta-sigma modulation. This switching amplifier is composed of a delta-sigma modulation circuit 1, a pulse amplifier 6, a low-pass filter 7, an attenuator 8, a level detection circuit 9, a frequency divider 10, and a multiplexer 11. The delta-sigma modulation circuit 1 consists of an adder 2, a group of integrators 3, an adder 4, and a quantizer 5.

The delta-sigma modulation circuit 1 converts an input signal $S_{IN}$ that is either an analog signal or a multi-bit signal into a 1-bit signal, and then sends the 1-bit signal to the pulse amplifier 6. The pulse amplifier 6 has a switching element (not shown) such as a FET. The pulse amplifier 6 performs power amplification of the 1-bit signal by switching the switching element according to the 1-bit signal, and then sends the 1-bit signal thus power-amplified to the low-pass filter 7 and the attenuator 8. The low-pass filter 7 eliminates high-frequency components from the output signal of the pulse amplifier 6, and then outputs an output signal $S_{OUT}$ that is an analog signal. The output signal $S_{OUT}$ thus obtained serves as an output signal of the switching amplifier.

On the other hand, the output signal of the pulse amplifier 6 is attenuated by the attenuator 8, and is then negatively fed back to the delta-sigma modulation circuit 1. This makes it possible to improve the distortion factor and the S/N ratio of the pulse amplifier 6.

The level detection circuit 9 detects the amplitude level of the input signal $S_{IN}$, and sends signals $S_X$ and $S_Y$ indicating the detection result, respectively, to the X and Y input terminals of the multiplexer 11. For example, the amplitude level of the input signal $S_{IN}$ is rated on a scale of level I to level IV in the order of increasing level. When the amplitude level is rated at level I, the signals $S_X$ and $S_Y$ both take "H (=High level)", when rated at level II, the signal $S_X$ takes "L (=Low level)" and the signal $S_Y$ takes "H", when rated at level III, the signal $S_X$ takes "H" and the signal $S_Y$ takes "L", and when rated at level IV, the signals $S_X$ and $S_Y$ both take "L" (see FIG. 2).

On the other hand, a clock signal CK of a predetermined frequency (e.g., 11.2 MHz) is fed to the frequency divider 10 and the A input terminal of the multiplexer 11. The frequency divider 10 divides the clock signal CK by two and then sends a ½ frequency division signal thus obtained (e.g., a signal of frequency 5.6 MHz) to the B input terminal of the multiplexer 11, divides the clock signal CK by four and then sends a ¼ frequency division signal thus obtained (e.g., a signal of frequency 2.8 MHz) to the C input terminal of the multiplexer 11, and divides the clock signal CK by eight and then sends a ⅛ frequency division signal thus obtained (e.g., a signal of frequency 1.4 MHz) to the D input terminal of the multiplexer 11. The multiplexer 11 selects one of the signals inputted to the A to D input terminals depending on the signals $S_X$ and $S_Y$ respectively inputted to the X and Y input terminals, and outputs the selected signal to the quantizer 5. For example, when the signals $S_X$ and $S_Y$ both take "H", the multiplexer 11 selects the ⅛ frequency division signal inputted to the D input terminal, and then outputs it. When the signal $S_X$ takes "L" and the signal $S_Y$ takes "H", the multiplexer 11 selects the ¼ frequency division signal inputted to the C input terminal, and then outputs it. When the signal $S_X$ takes "H" and the signal $S_Y$ takes "L", the multiplexer 11 selects the ½ frequency division signal inputted to the B input terminal, and then outputs it. When the signals $S_X$ and $S_Y$ both take "L", the multiplexer 11 selects the clock signal CK inputted to the A input terminal, and then outputs it (see FIG. 2).

The quantizer 5 performs sampling based on the output signal of the multiplexer 11, and therefore the sampling frequency of the quantizer 5 corresponds to the frequency of the output signal of the multiplexer 11. Thus, since the sampling frequency of the delta-sigma modulation circuit 1 varies according to the amplitude level of the input signal $S_{IN}$, it is possible to make higher the sampling frequency of the delta-sigma modulation circuit 1 only when the input signal $S_{IN}$ takes a high amplitude level and therefore a higher oscillation threshold is required. This makes it possible to reduce to a minimum the number of switching operations performed by the pulse amplifier 6 in a steady state in which the amplitude level of the input signal $S_{IN}$ is low, making it possible to obtain a desired oscillation threshold and improve electric power efficiency.

Figure 3:
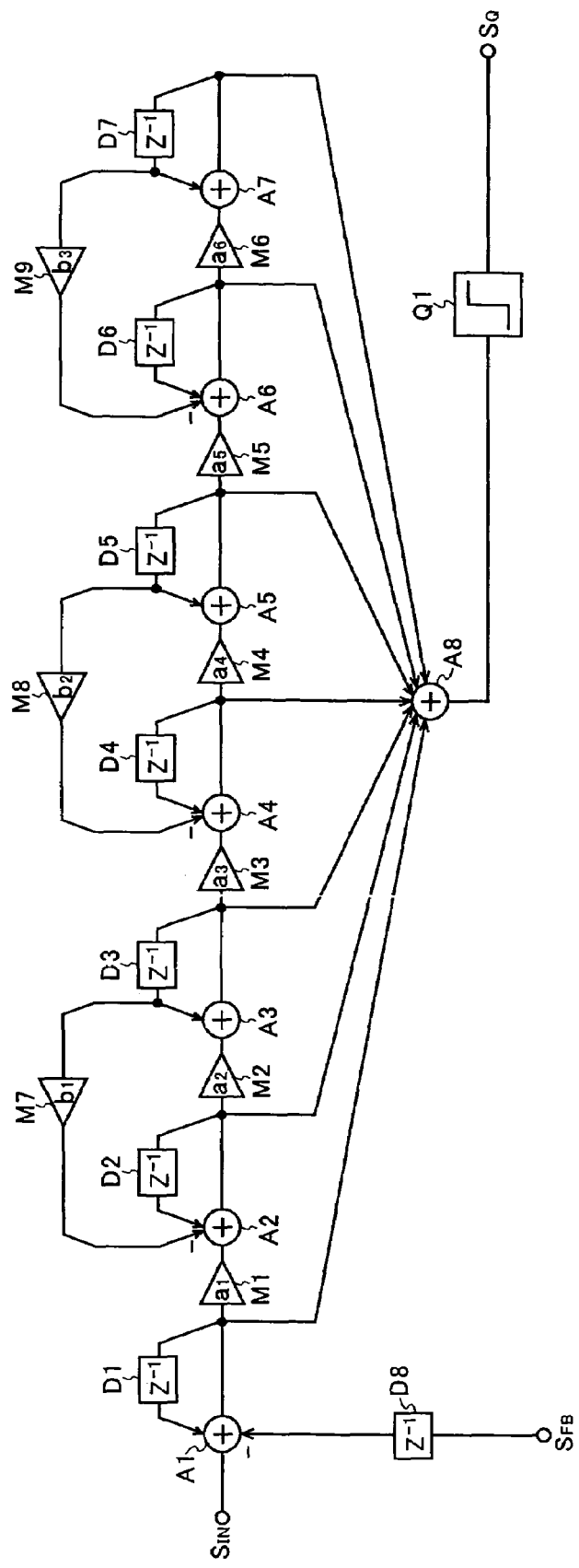
FIG. 3 is a diagram showing an example of the configuration of the delta-sigma modulation circuit included in the switching amplifier shown in FIG. 1.

Here, a specific example of the configuration of the delta-sigma modulation circuit 1 is shown in FIG. 3. The seventh-order delta-sigma modulation circuit shown in FIG. 3 is composed of adders A1 to A8, delay devices D1 to D8, multipliers M1 to M9, and a quantizer Q1.

A first integrator consisting of the adder A1 and the delay device D1, a second integrator consisting of the multiplier M1, the adder A2, and the delay device D2, a third integrator consisting of the multiplier M2, the adder A3, and the delay device D3, a fourth integrator consisting of the multiplier M3, the adder A4, and the delay device D4, a fifth integrator consisting of the multiplier M4, the adder A5, and the delay device D5, a sixth integrator consisting of the multiplier M5, the adder A6, and the delay device D6, and a seventh integrator consisting of the multiplier M6, the adder A7, and the delay device D7 are connected in a cascade arrangement. The multipliers M1 to M6 perform multiplication by using predetermined multiplier factors $a_1$ to $a_6$, respectively, and therefore the input gain coefficients of the second to seventh integrators are $a_1$ to $a_6$, respectively. The adder A1 also performs the function of feeding back negatively to the input signal $S_{IN}$ a signal obtained by delaying a feedback signal $S_{FB}$ based on the quantized signal $S_Q$ with the delay device D8.

Moreover, the output of the delay device D3 is multiplied by the multiplier M7 by a predetermined multiplier factor $b_1$, and is then negatively fed back to the input signal of the second integrator. Similarly, the output of the delay device D5 is multiplied by the multiplier M8 by a predetermined multiplier factor $b_2$, and is then negatively fed back to the input signal of the fourth integrator. The output of the delay device D7 is multiplied by the multiplier M9 by a predetermined multiplier factor $b_3$, and is then negatively fed back to the input signal of the sixth integrator. Thus, the feedback gain coefficients of the second, fourth, and sixth integrators are $b_1$ to $b_3$, respectively.

The outputs of the first to seventh integrators are added together by the adder A8, and then quantized by the quantizer Q1 to obtain a quantized signal $S_Q$.

It is preferable that the integrator included in the delta-sigma modulation circuit be a CR integrator, because using the CR integrator makes it possible to fix the zero-point frequency of the delta-sigma modulation circuit even when the sampling frequency of the delta-sigma modulation circuit is switched from one frequency to another, and thereby stabilize the quantization noise distribution.

The seventh-order delta-sigma modulation circuit shown in FIG. 3 is taken up as an example for the purpose of explaining the relationship between the sampling frequency and the zero-point frequency of the delta-sigma modulation circuit. The zero-point frequency $f_i$ of the seventh-order delta-sigma modulation circuit shown in FIG. 3 is given by the following equation (1):

$$f_i = \frac{1}{2\pi} \cdot Fs \cdot \sqrt{a_{2i} \cdot b_i} \quad i = 1, 2, 3 \qquad (1)$$

where

Fs represents the sampling frequency;

$a_2$, $a_4$, and $a_6$ represent the input gain coefficients of the third, fifth, and seventh integrators, respectively; and $b_1$ to $b_3$ represent the feedback gain coefficients of the second, fourth, and sixth integrators, respectively.

Equation (1) shows that the zero-point frequency $f_i$ of the seventh-order delta-sigma modulation circuit shown in FIG. 3 depends on the sampling frequency Fs, the input gain coefficients $a_2$, $a_4$, and $a_6$ of the third, fifth, and seventh integrators, and the feedback gain coefficients $b_1$ to $b_3$ of the second, fourth, and sixth integrators.

The integrator used in the delta-sigma modulation circuit is usually either a switched-capacitor integrator or a CR integrator.

Figure 4:
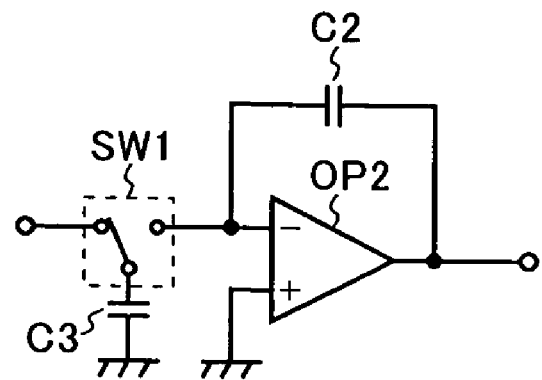
FIG. 4 is a diagram showing the configuration of a typical switched-capacitor integrator.

The configuration of a typical switched-capacitor integrator is shown in FIG. 4. The switched-capacitor integrator shown in FIG. 4 consists of capacitors C2 and C3, an operational amplifier OP2, and a switch SW1. The transfer function $H_{SW}(\omega)$ of the switched-capacitor integrator shown in FIG. 4 is given by the following equation (2):

$$H_{SW}(\omega) = -\frac{C_3}{C_2} \cdot \frac{Fs}{j\omega} \qquad (2)$$

where

Fs represents the sampling frequency;

$C_2$ represents the capacitance value of the capacitor C2; and $C_3$ represents the capacitance value of the capacitor C3.

Equation (2) shows that the gain coefficient of the switched-capacitor integrator shown in FIG. 4 is $-C_2/C_3$, meaning that the gain coefficient is constant independent of the sampling frequency Fs. Here, suppose that the switched-capacitor integrator shown in FIG. 4 is used in the seventh-order delta-sigma modulation circuit shown in FIG. 3. Then, according to equation (1), when the sampling frequency Fs is doubled, the zero-point frequency $f_i$ of the seventh-order delta-sigma modulation circuit shown in FIG. 3 is also doubled, because both the input gain coefficient and the feedback gain coefficient of the switched-capacitor integrator remain constant. As described above, when the switched-capacitor integrator is used in the delta-sigma modulation circuit, variations in the sampling frequency cause variations in the zero-point frequency. This makes a characteristic of the quantization noise distribution different from the one as designed.

Figure 6:
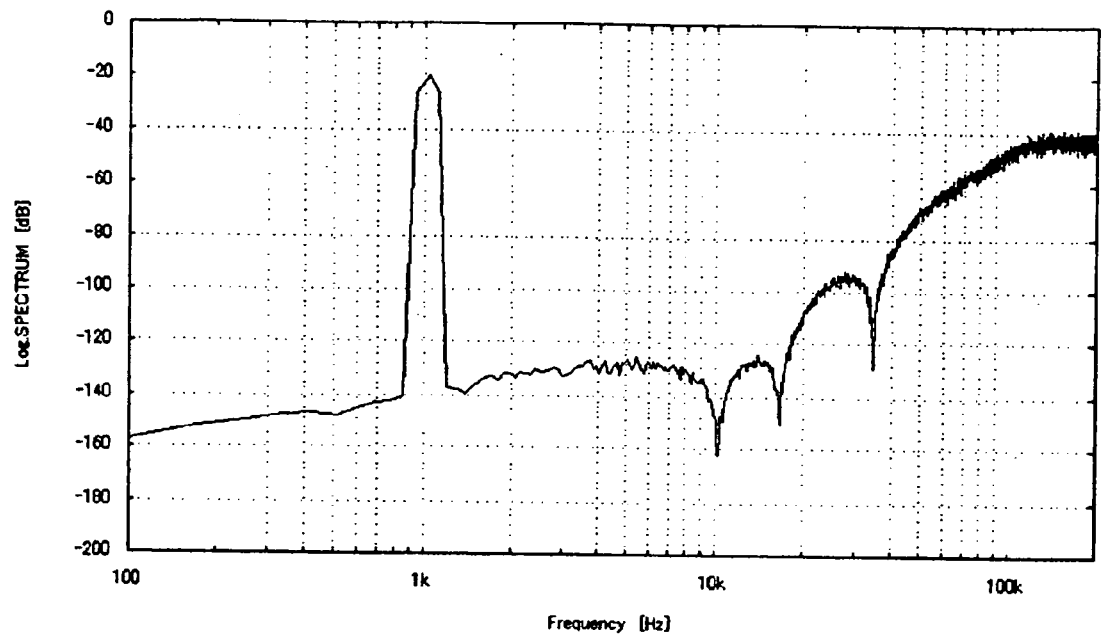
FIG. 6 shows the distribution of quantization noise when the delta-sigma modulation circuit shown in FIG. 3 uses switched-capacitor integrators and operates at a sampling frequency of 2.8 MHz.
Figure 7:
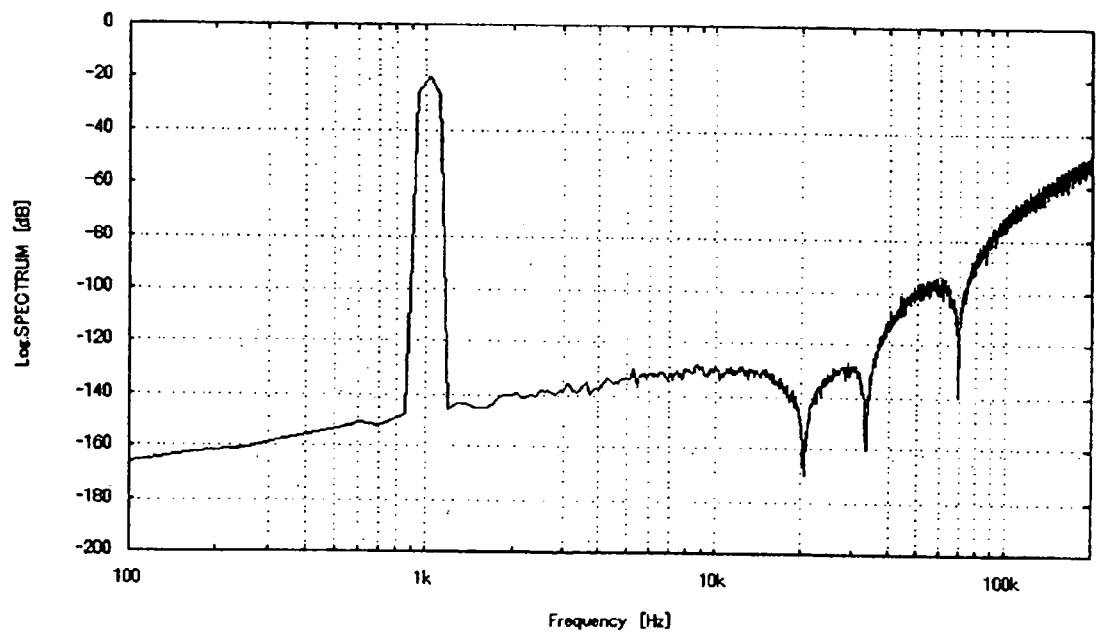
FIG. 7 shows the distribution of quantization noise when the delta-sigma modulation circuit shown in FIG. 3 uses switched-capacitor integrators and operates at a sampling frequency of 5.6 MHz.

Here, the quantization noise distribution obtained when the seventh-order delta-sigma modulation circuit shown in FIG. 3 uses the switched-capacitor integrator shown in FIG. 4 and operates at a sampling frequency of 2.8 MHz is shown in FIG. 6, and the quantization noise distribution obtained when the seventh-order delta-sigma modulation circuit shown in FIG. 3 uses the switched-capacitor integrator shown in FIG. 4 and operates at a sampling frequency of 5.6 MHz is shown in FIG. 7. It is to be noted that the horizontal axes of the graphs shown in FIGS. 6 and 7 each represent the frequency of the quantized signal $S_Q$, and the vertical axes thereof each represent the level of the quantized signal $S_Q$. As seen in FIGS. 6 and 7, when the switched-capacitor integrator shown in FIG. 4 is used in the seventh-order delta-sigma modulation circuit shown in FIG. 3, the zero-point frequency shifts as the sampling frequency varies. In this example, when the sampling frequency is doubled, each of the three zero-point frequencies is shifted to twice its frequency.

Figure 5:
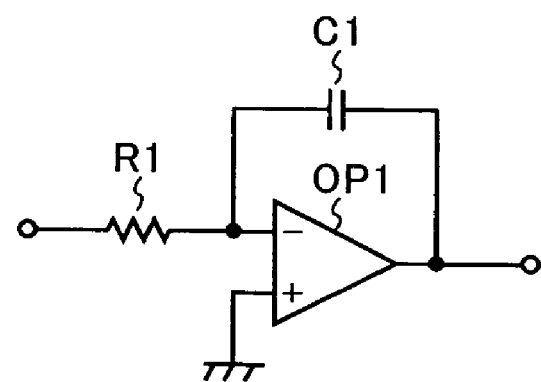
FIG. 5 is a diagram showing the configuration of a typical CR integrator.

Next, the configuration of a typical CR integrator is shown in FIG. 5. The CR integrator shown in FIG. 5 consists of a capacitor C1, a resistance R1, and an operational amplifier OP1. The transfer function $H_{CR}(\omega)$ of the CR integrator shown in FIG. 5 is given by the following equation (3):

$$H_{CR}(\omega) = -\frac{1}{C_1 \cdot R_1 \cdot Fs} \cdot \frac{Fs}{j\omega} \qquad (3)$$

where

Fs represents the sampling frequency;

$C_1$ represents the capacitance value of the capacitor C1; and $R_1$ represents the resistance value of the resistance R1.

Equation (3) shows that the gain coefficient of the CR integrator shown in FIG. 5 is $-1/(C_1 \cdot R_1 \cdot Fs)$, meaning that the gain coefficient depends on the sampling frequency Fs. Here, suppose that the CR integrator shown in FIG. 5 is used in the seventh-order delta-sigma modulation circuit shown in FIG. 3. Then, according to equation (1), even when the sampling frequency Fs is doubled, the zero-point frequency $f_i$ of the seventh-order delta-sigma modulation circuit shown in FIG. 3 does not vary, because the input gain coefficient $a_2$ of the third integrator, the input gain coefficient a4 of the fifth integrator, the input gain coefficient $a_6$ of the seventh integrator, the feedback gain coefficient $b_1$ of the second integrator, the feedback gain coefficient $b_2$ of the fourth integrator, and the feedback gain coefficient $b_3$ of the sixth integrator are each halved when the sampling frequency Fs is doubled. As described above, when the CR integrator is used in the delta-sigma modulation circuit, variations in the sampling frequency do not cause variations in the zero-point frequency. This makes it possible to keep the characteristic of the quantization noise distribution as designed.

Figure 8:
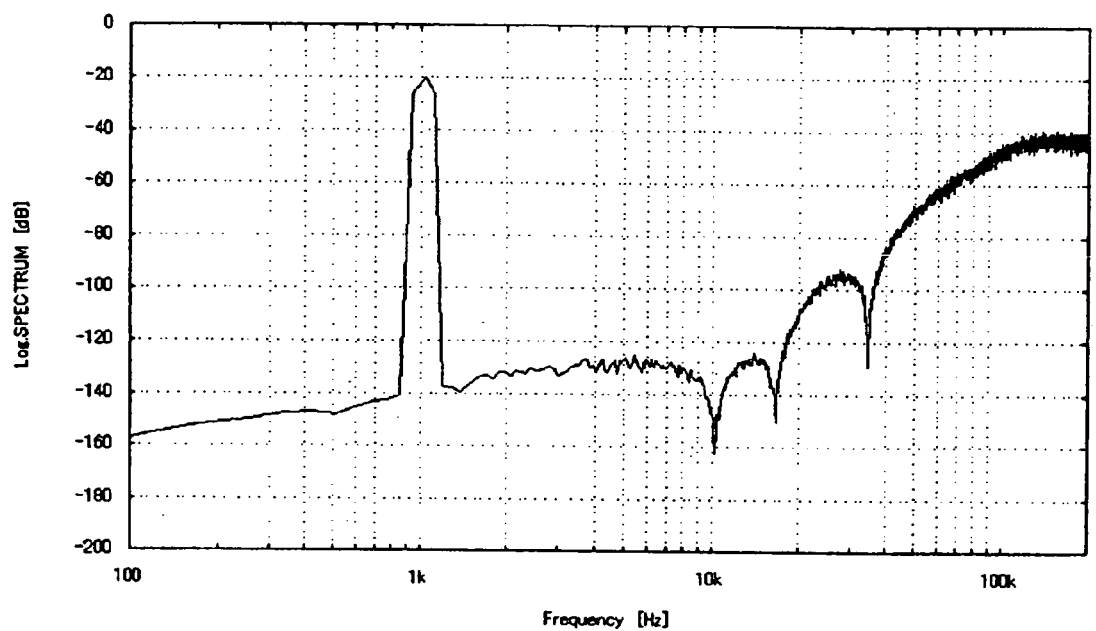
FIG. 8 shows the distribution of quantization noise when the delta-sigma modulation circuit shown in FIG. 3 uses CR integrators and operates at a sampling frequency of 2.8 MHz.
Figure 9:
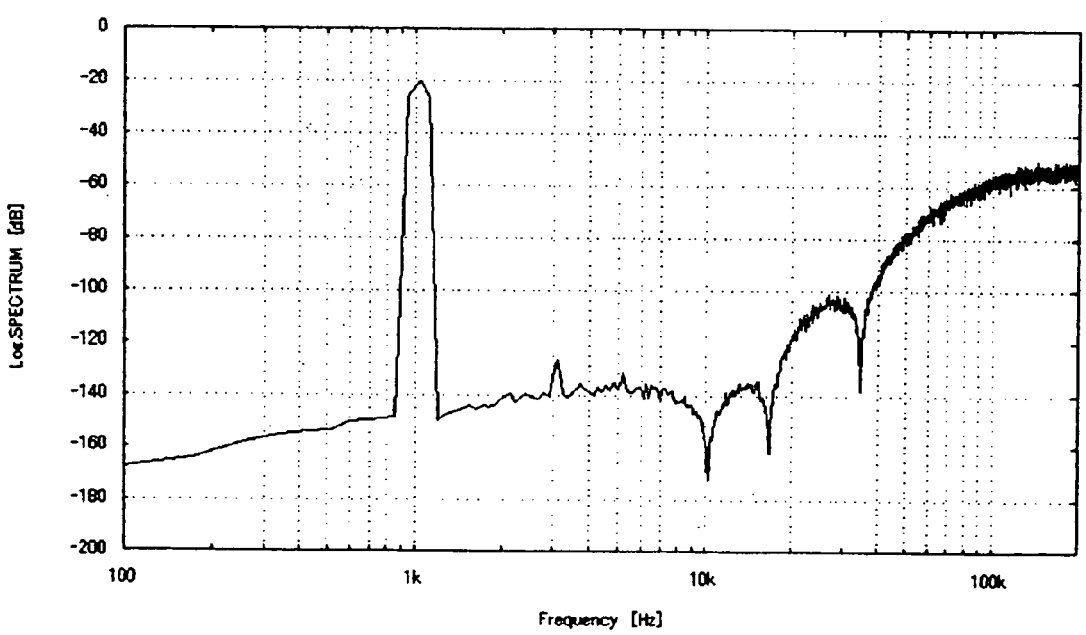
FIG. 9 shows the distribution of quantization noise when the delta-sigma modulation circuit shown in FIG. 3 uses CR integrators and operates at a sampling frequency of 5.6 MHz.

Here, the quantization noise distribution obtained when the seventh-order delta-sigma modulation circuit shown in FIG. 3 uses the CR integrator shown in FIG. 5 and operates at a sampling frequency of 2.8 MHz is shown in FIG. 8, and the quantization noise distribution obtained when the seventh-order delta-sigma modulation circuit shown in FIG. 3 uses the CR integrator shown in FIG. 5 and operates at a sampling frequency of 5.6 MHz is shown in FIG. 9. It is to be noted that the horizontal axes of the graphs shown in FIGS. 8 and 9 each represent the frequency of the quantized signal $S_Q$, and the vertical axes thereof each represent the level of the quantized signal $S_Q$. As seen in FIGS. 8 and 9, when the CR integrator shown in FIG. 5 is used in the seventh-order delta-sigma modulation circuit shown in FIG. 3, the zero-point frequency does not shift even when the sampling frequency varies. In this example, even when the sampling frequency is doubled, three zero-point frequencies do not shift and remain as they are.

What is claimed is:

1. A switching amplifier comprising:
    a delta-sigma modulation circuit that is a circuit for performing delta-sigma modulation of an input signal and outputting a quantized signal, the delta-sigma modulation circuit including
        a group of integrators that consists of a plurality of integrators connected in a cascade arrangement and receives the input signal at a first-stage integrator, and
        a quantizer that quantizes a signal based on an output signal of the group of integrators and outputs a quantized signal,
        the delta-sigma modulation circuit that feeds back a signal based on the quantized signal to the first-stage integrator;
    a pulse amplifier that has a switching element and performs pulse amplification of the quantized signal by switching the switching element according to the quantized signal;
    an amplitude level detector that detects an amplitude level of the input signal; and
    a sampling frequency adjuster that varies a sampling frequency of the quantizer according to a detection result of the amplitude level detector.

2. The switching amplifier of claim 1, further comprising:
a converter that converts an output signal of the pulse amplifier into an analog signal.

3. The switching amplifier of claim 1, further comprising:
an attenuator that attenuates an output signal of the pulse amplifier and then feeds back the attenuated signal to the first-stage integrator.

4. The switching amplifier of claim 2, further comprising:
an attenuator that attenuates an output signal of the pulse amplifier and then feeds back the attenuated signal to the first-stage integrator.

5. The switching amplifier of claim 1,
wherein the plurality of integrators included in the group of integrators are CR integrators.

6. The switching amplifier of claim 2,
wherein the plurality of integrators included in the group of integrators are CR integrators.

7. The switching amplifier of claim 3.
wherein the plurality of integrators included in the group of integrators are CR integrators.

8. The switching amplifier of claim 4,
wherein the plurality of integrators included in the group of integrators are CR integrators.

* * * * *